(12) United States Patent
Tzu et al.

(10) Patent No.: US 6,194,103 B1
(45) Date of Patent: Feb. 27, 2001

(54) E-BEAM DOUBLE EXPOSURE METHOD FOR MANUFACTURING ASPM MASK WITH CHROME BORDER

(75) Inventors: San-De Tzu, Taipei; Chinq-Shiun Chiu, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/349,848

(22) Filed: Jul. 8, 1999

(51) Int. Cl.$^7$ ................. G03F 9/00; G03C 5/00
(52) U.S. Cl. ......................... 430/5; 430/394
(58) Field of Search ..................... 430/5, 322, 323, 430/296, 394

(56) References Cited

U.S. PATENT DOCUMENTS

| | | | |
|---|---|---|---|
| 5,480,747 | 1/1996 | Vasudev | 430/5 |
| 5,503,951 | 4/1996 | Flanders et al. | 430/5 |
| 5,565,286 | 10/1996 | Lin | 430/5 |
| 5,783,337 | 7/1998 | Tzu et al. | 430/5 |
| 5,849,437 | * 12/1998 | Yamazaki et al. | 430/5 |
| 6,057,066 | * 5/2000 | Hanawa | 430/5 |

OTHER PUBLICATIONS

G. Owen et al., "Proximity Effect Correction for Electron Beam Lithography by Equalization of Background Dose", Journal of Applied Physics, vol. 54, No. 6, Jun. 1983, pp. 3753–3581.

* cited by examiner

*Primary Examiner*—S. Rosasco
(74) *Attorney, Agent, or Firm*—George O. Saile; Stephen B. Ackerman; Larry J. Prescott

(57) ABSTRACT

A method of forming attenuating phase shifting masks having an opaque border on a mask blank having a layer of attenuating phase shifting material overlaying a transparent mask substrate, a layer of opaque material overlaying the layer of attenuating phase shifting material, and a layer of resist overlaying the layer of opaque material. First pattern regions are exposed in the resist using an electron beam and a first exposure dose. Second pattern regions surrounding each of the first pattern regions, are left unexposed providing a width of unexposed resist around each of the first pattern regions. Third pattern regions surrounding each of the second pattern regions are exposed in the resist using the same electron beam and a second exposure dose, which is less than the first exposure dose. A border region of resist around the outer periphery of the mask is not exposed. The resist is then developed and the first pattern regions in the layers of opaque material and attenuating phase shifting material are etched away. The resist and opaque material, except for the border region, are then etched away and the remaining resist is removed. The first width of unexposed resist provides good pattern accuracy.

18 Claims, 5 Drawing Sheets

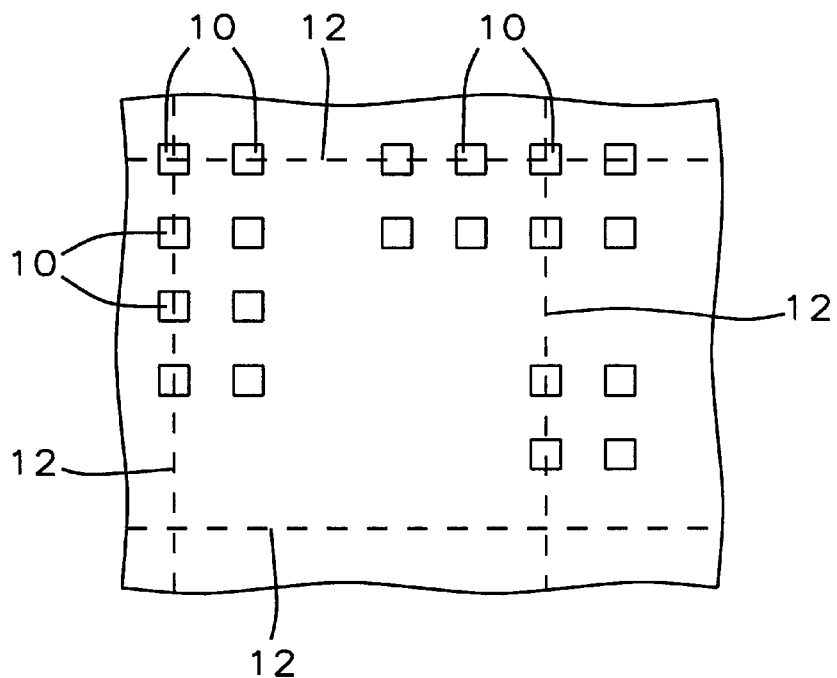
*FIG. 1 - Prior Art*
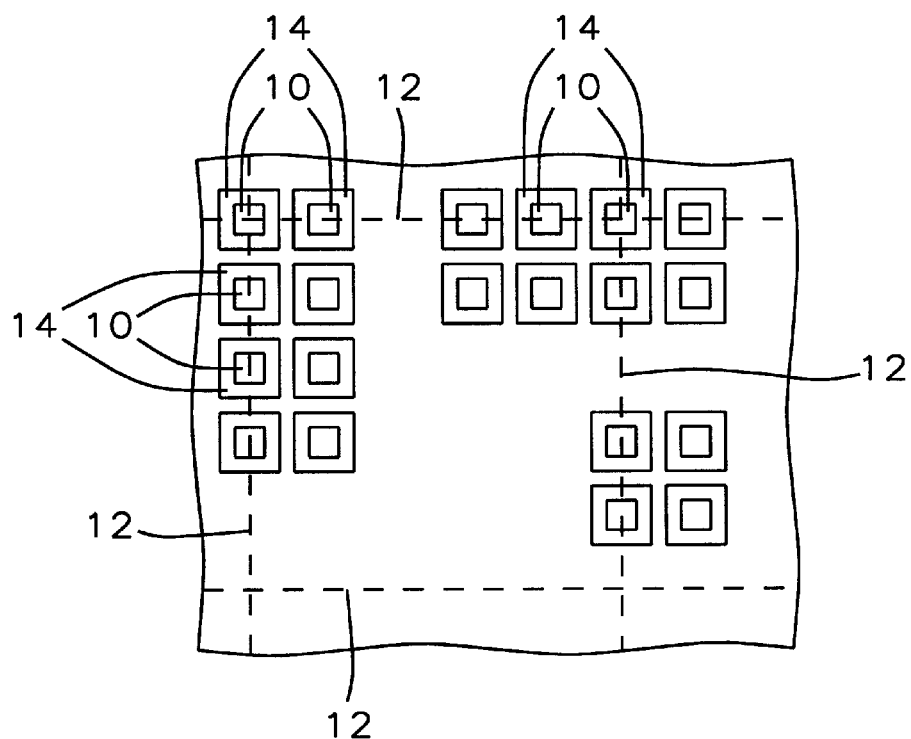
*FIG. 2*

E-BEAM DOUBLE EXPOSURE METHOD FOR MANUFACTURING ASPM MASK WITH CHROME BORDER

BACKGROUND OF THE INVENTION

1. Field of the Invention

This invention relates to methods of fabrication of a photomask and more particularly to methods of fabrication of an attenuating phase shifting photomask using a modulated electron beam to expose a layer of resist.

2. Description of the Related Art

As photolithography advances to 0.35 microns and below, new technologies are required to provide accurate photolithographic patterns. One such new technology involves the use of attenuating phase shifting materials to form mask images. The attenuating phase shifting material both shifts the phase of light passing through the material, usually by 180°, and provides a partial absorption of the light passing through the material. Attenuating phase shifting masks often use opaque material, usually chrome, in conjunction with the attenuating phase shifting material to prevent unwanted exposure of photoresist in border regions or corner regions of masks where multiple exposure steps can result in unwanted exposure of photoresist.

U.S. Pat. No. 5,738,337 to Tzu et al. describes a method of fabricating a attenuating phase shifting photomask with a chrome border using two exposure doses of a single electron beam.

U.S. Pat. No. 5,480,747 to Vasudev describes an attenuated phase shifting mask using buried absorbers.

U.S. Pat. No. 5,503,951 to Flanders et al. describes an attenuating phase shifting mask and fabrication method for a mask having recessed attenuating phase shifting regions.

U.S. Pat. No. 5,565,286 to Lin describes a structure and fabrication method for a phase shifting mask.

A paper by G. Owen and P. Rissman, Journal of Applied Physics, Vol. 54, No. 6, June 1983, pages 3753–3581 describes proximity effect and methods of correcting for proximity effect.

SUMMARY OF THE INVENTION

Attenuating phase shifting masks are fabricated using electron beam exposure to form patterns in a layer of resist on a mask blank. The mask blank comprises a transparent mask substrate with a layer of attenuating phase shifting material formed thereon. A layer of opaque material is formed on the layer of attenuating phase shifting material. A layer of resist is then formed on the layer of opaque material. FIG. 1 shows a diagram of a conventional pattern layout of a mask pattern which will be used to form via holes in an integrated circuit wafer. First pattern regions 10 will be used to form the via holes and will be transferred to the mask blank. The field boundaries 12 are indicated by dashed lines in FIG. 1 and represent the regions within which the electron beam can be deflected without moving the mask blank relative to the electron beam apparatus. After each field is exposed the mask blank and electron beam apparatus must be moved before the next field is exposed.

Special care must be taken to insure that pattern accuracy is achieved at the edge of the field boundaries of the mask pattern. The pattern at the edge of a field boundary is subject to inaccuracies due to problems such as stitching effect, caused by multiple exposures at the field boundaries, and proximity effect, caused by back scattering of electrons used to expose a layer of resist.

It is a principle objective of this invention to provide a method of forming a mask using a single modulated electron beam which has good pattern accuracy at the field and pattern boundaries.

This objective is achieved by using a modulated electron beam to expose a layer of resist on a mask blank. The resist will be exposed to form a first number of first pattern regions, the first number of second pattern regions, the first number of third pattern regions, and a fourth pattern region. Each of the second pattern regions surrounds one of the first pattern regions and provides a first width of unexposed resist around each of the first pattern regions. Each of the third pattern regions surrounds one of the second pattern regions and the fourth pattern region surrounds all of the first pattern regions, all of the second pattern regions, and all of the third pattern regions forming a border region of the mask.

FIG. 2 shows a diagram of the mask pattern layout of this invention for a mask which will be used to form via holes in an integrated circuit wafer. First pattern regions 10 will be used to form the via holes. The field boundaries 12 are indicated by dashed lines in FIG. 2. The second pattern regions 14 are shown in FIG. 2 and are regions where the resist is not exposed by the electron beam.

The modulated electron beam exposes the first number of first pattern regions with a first exposure level and the first number of third pattern regions with a second exposure level without exposing the first number of second pattern regions or the fourth pattern region. The second exposure level is less than the first exposure level. The first pattern regions are the part of the mask pattern which is to be transferred to a layer of photoresist on an integrated circuit wafer. The first width of unexposed resist surrounding the first pattern regions prevents stitching effect caused by poor electron beam shot connections on the third pattern regions from occurring. Therefor, the first width of unexposed resist provides good pattern accuracy at the field boundaries. The second exposure on the third pattern regions compensates for proximity effect. Conceptually, this is like the ghost technique in that the first exposure on the first pattern regions serves as the "pattern exposure" and the second exposure on the third pattern regions serves as a "correction exposure".

The layer of resist is then developed to expose the layer of opaque material in the first pattern regions. The opaque material in the first pattern regions is then etched away using wet etching exposing the layer of attenuating phase shifting material in the first pattern regions. The attenuating phase shifting material in the first pattern regions is then etched away using dry anisotropic etching. The remaining part of the layer of resist except the fourth pattern region, or border region, is then removed using oxygen plasma etching and that part of the layer of opaque material not covered by the resist in the border region is etched away using wet etching. The remaining resist is then removed and the mask is cleaned.

BRIEF DESCRIPTION OF THE DRAWINGS

FIG. 1 shows a diagram of a conventional pattern layout of a mask pattern which will be used to form via holes in an integrated circuit wafer.

FIG. 2 shows a diagram of the mask pattern layout of this invention which will be used to form via holes in an integrated circuit wafer.

DESCRIPTION OF THE PREFERRED EMBODIMENTS

Figure 3:
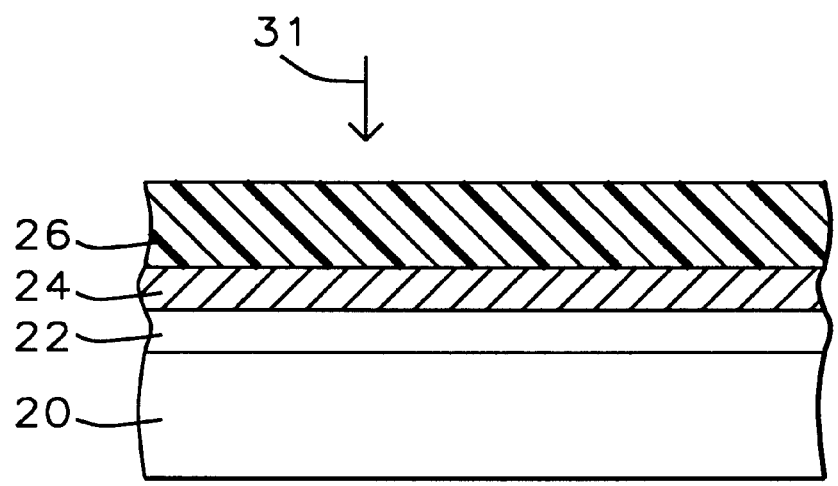
FIG. 3 shows a cross section view of a mask blank and the electron beam used to expose the layer of resist on the mask blank.

Refer now to FIGS. 3–11 for a detailed description of the method of forming an attenuating phase shifting mask of this invention. FIG. 3 shows a cross section view of a mask blank having a transparent mask substrate 20, such as quartz, with a layer of attenuating phase shifting material 22 formed thereon. The layer of attenuating phase shifting material can be a material such as MoSiON having a thickness of between about 900 and 1350 Angstroms or CrON having a thickness of between about 900 and 1350 Angstroms. A layer of opaque material 24 is then formed on the layer of attenuating phase shifting material. The layer of opaque material 24 can be a layer of chrome having a thickness of between about 500 and 1000 Angstroms.

Figure 4:
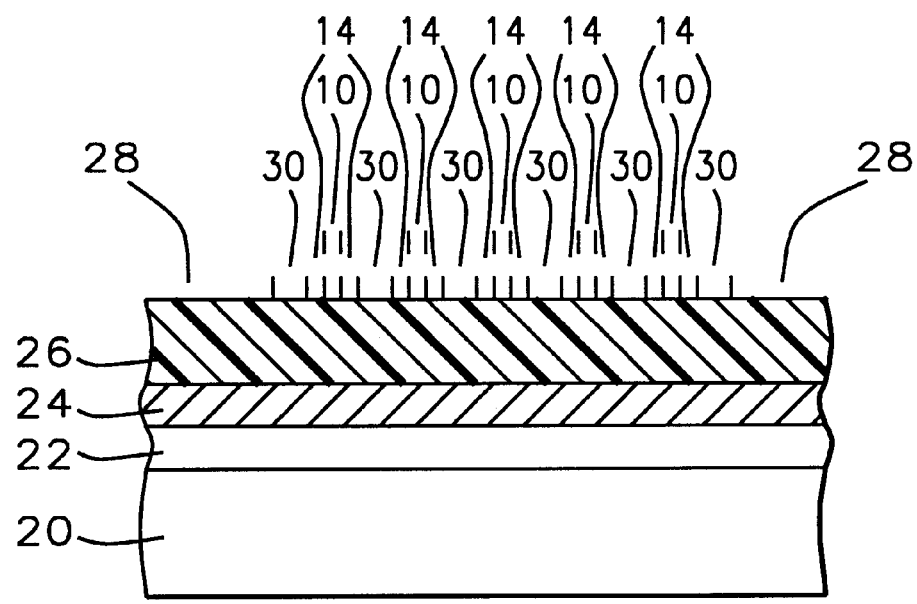
FIG. 4 shows a cross section view of a mask blank showing the first pattern regions, second pattern regions, third pattern regions, and fourth pattern region.

As shown in FIG. 3 the layer of resist 26 is exposed using a single modulated electron beam 31 using two exposure doses. As shown in FIG. 4 the resist 26 will then be exposed to form a first number of first pattern regions 10, the first number of second pattern regions 14, the first number of third pattern regions 30, and a fourth pattern region 28. Each of the second pattern regions 14 surrounds one of the first pattern regions 10 and provides a first width of unexposed resist around each of the first pattern regions 10. The first width is between about 500 and 1500 Angstroms. Each of the third pattern regions 30 surrounds one of the second pattern regions 14 and the fourth pattern region 28 forms a border region around all of the first pattern regions 10, all of the second pattern regions 14, and all of the third pattern regions 30 forming a border region 28 of the mask. The modulated electron beam exposes the first number of first pattern regions 10 with a first exposure level and the first number of third pattern regions 30 with a second exposure level without exposing the first number of second pattern regions 14 or the fourth pattern region 28. The first exposure level, between about 20 and 30 $\mu C/cm^2$ for a 50 keV electron beam, is greater than the first exposure level and is sufficient to expose the entire thickness of the layer of resist 26. The second exposure level is between about 6 and 12 $\mu C/cm^2$ for a 50 keV electron beam and is sufficient to expose only a part of the thickness of the layer of resist 26.

Figure 5:
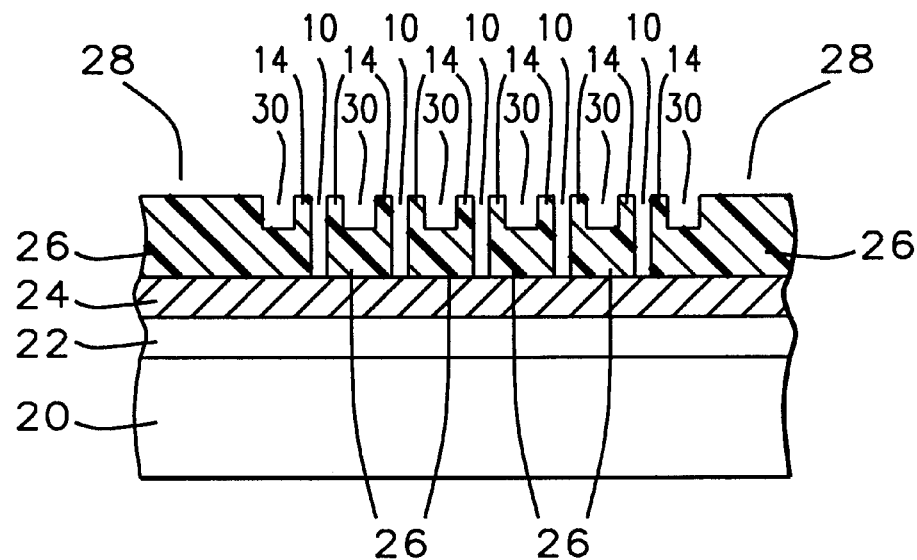
FIG. 5 shows a cross section of the mask after the layer of resist has been exposed and developed.
Figure 6:
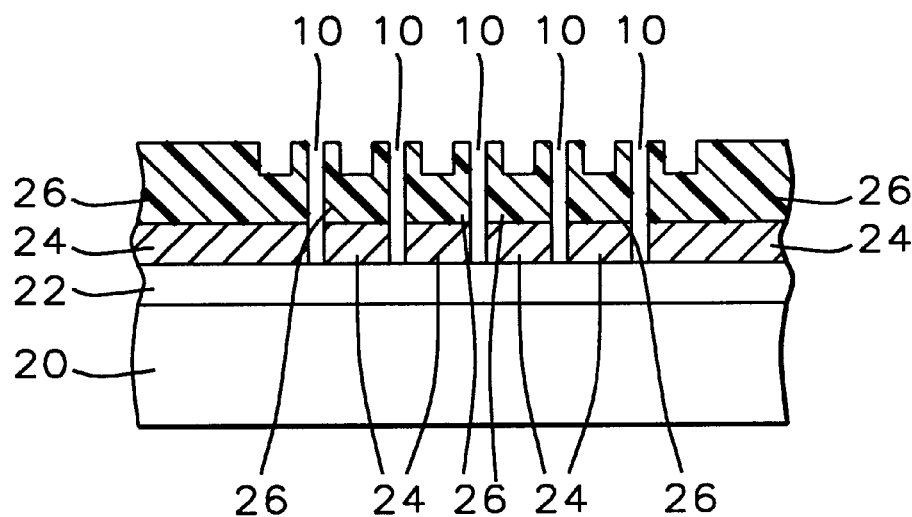
FIG. 6 shows a cross section of the mask after the first pattern has been etched in the layer of opaque material.
Figure 7:
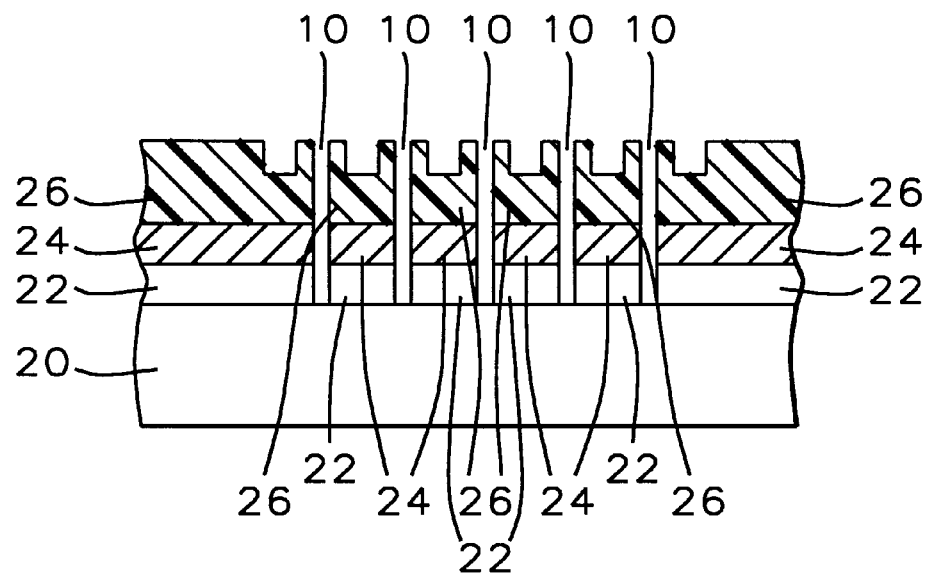
FIG. 7 shows a cross section of the mask after the first pattern has been etched in the layer of attenuating phase shifting material.

As shown in FIG. 5 the layer of resist is then developed exposing the layer of chrome 24, or other opaque material, in the first pattern regions 10. Part of the layer of resist in the second pattern regions 30 is also removed. As shown in FIG. 5 the developing does not remove any resist from the second pattern regions 14 or the border regions 28. As shown in FIG. 6 the chrome 24 in the first pattern region 10 is then etched away with wet etching, using an etchant such as $HClO_4+Cl(NH_4)_2(NO_3)_6$, CR-7, and the developed layer of resist as a mask. Next, as shown in FIG. 7, the attenuating phase shifting material 24 in the first pattern region 10 is then etched away with dry anisotropic etching, using an etchant such as $CF_4+O_2$ and the developed layer of resist as a mask.

Figure 8:
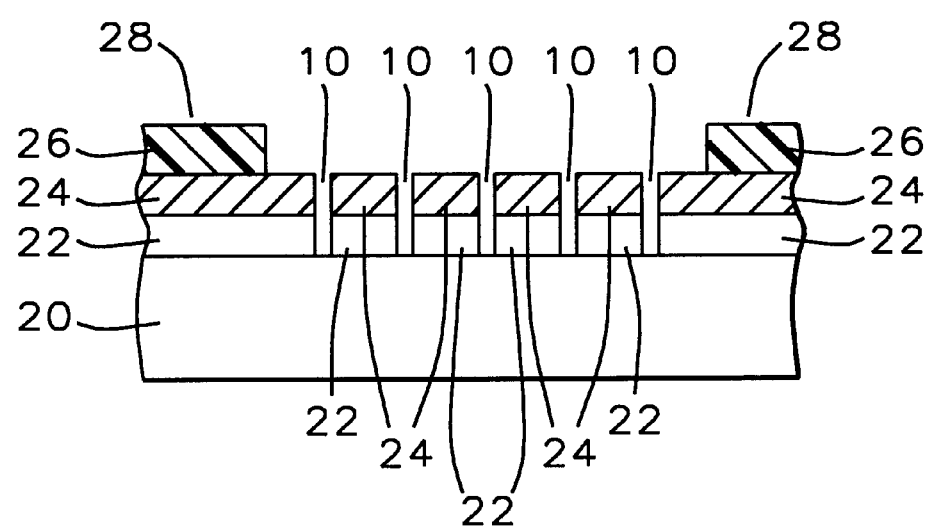
FIG. 8 shows a cross section of the mask after the all the layer of resist except in the fourth pattern region has been removed.
Figure 9:
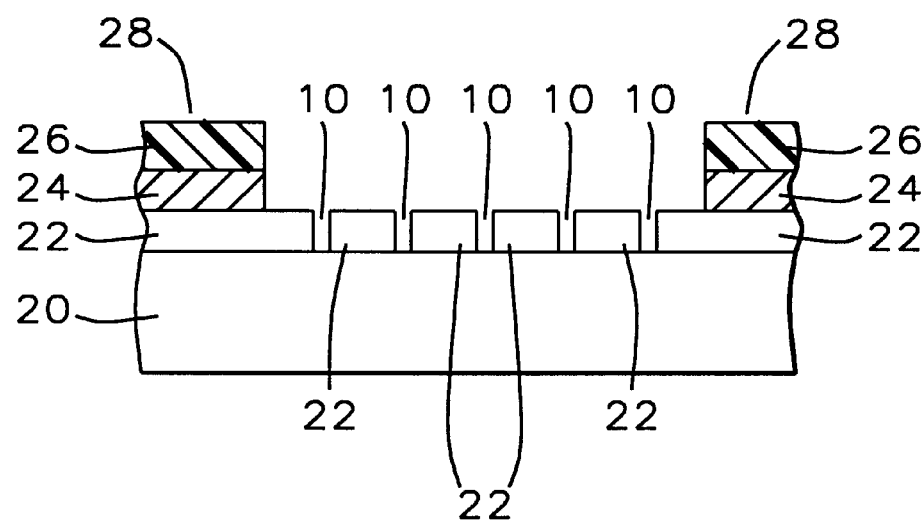
FIG. 9 shows a cross section of the mask after the all the layer of opaque material except in the fourth pattern region has been etched away.

As shown in FIG. 8, all of the layer of resist except the resist in the border region 28 is etched away using an oxygen plasma etch. Since the resist in the border region 28 is thicker than the remaining resist on the mask except for the first width of resist in the second pattern region 14, and since the first width is small, between about 500 and 1500 Angstroms, no masking is required to remove all of the layer of resist except the resist in the border region 28. Next, as shown in FIG. 9, the layer of chrome 24, or other opaque material, except for the chrome in the border region protected by the remaining resist is removed by wet etching, using an etchant such as $HClO_4+Cl(NH_4)_2(NO_3)_6$, CR-7.

Figure 10:
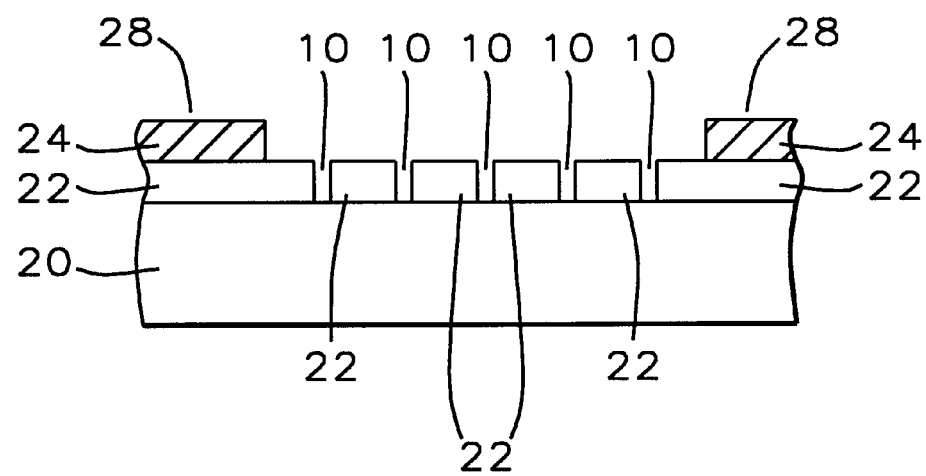
FIG. 10 shows a cross section of the completed mask after all the remaining resist has been removed.

As shown in FIG. 10 the remaining resist is then stripped and the mask is cleaned. The mask uses attenuating phase shifting material 22 to define the first pattern regions 10 which will be transferred to a layer of photoresist formed on an integrated circuit wafer. The chrome, or other opaque material, border 28 prevents problems of unwanted exposure of the photoresist on the wafer due to multiple exposures at the pattern edges.

While the invention has been particularly shown and described with reference to the preferred embodiments thereof, it will be understood by those skilled in the art that various changes in form and details may be made without departing from the spirit and scope of the invention.

What is claimed is:

1. A method of forming an attenuating phase shifting mask, comprising:

providing a photomask blank comprising a layer of attenuating phase shifting material overlaying a transparent mask substrate and a layer of opaque material overlaying said layer of attenuating phase shifting material;

forming a layer of resist on said layer of attenuating phase shifting material;

exposing said layer of resist using a single modulated electron beam thereby exposing a number of first pattern regions with a first exposure level and an equal number of third pattern regions with a second exposure level without exposing an equal number of second pattern regions or a fourth pattern region, wherein each of said second pattern regions surrounds one of said first pattern regions providing a critical width of unexposed resist around each of said first pattern regions, each of said third pattern regions surrounds one of said second pattern regions, said second exposure level is less than said first exposure level, and said fourth pattern region surrounds all of said first pattern regions, all of said second pattern regions, and all of said third pattern regions;

developing said layer of resist thereby removing that part of said resist in said first pattern regions, exposing said layer of opaque material in said first pattern regions, reducing the thickness of that part of said resist in said third pattern regions, leaving the full thickness of said resist in said second pattern regions, and leaving the full thickness of said resist in said fourth pattern region;

etching away said opaque material in said first pattern regions using wet etching and said developed layer of resist as a mask thereby exposing said layer of attenuating phase shifting material in said first pattern regions;

etching away said attenuating phase shifting material in said first pattern regions using dry anisotropic etching and said developed layer of resist as a mask;

removing the remaining part of said layer of resist in said second pattern regions and said third pattern regions using oxygen plasma etching leaving a reduced thickness of said resist in said fourth pattern region;

etching away that part of said opaque material not covered by said reduced thickness of resist in said fourth pattern region using wet etching and said reduced thickness of resist in said fourth pattern region as a mask thereby leaving said opaque material in said fourth pattern region; and removing the remaining said resist.

2. The method of claim 1 wherein said attenuating phase shifting material comprises MoSiON having a thickness of between about 900 and 1350 Angstroms.

3. The method of claim 1 wherein said attenuating phase shifting material comprises CrON having a thickness of between about 900 and 1350 Angstroms.

4. The method of claim 1 wherein said opaque material comprises chrome having a thickness of between about 500 and 1000 Angstroms.

5. The method of claim 1 wherein said transparent mask substrate is quartz.

6. The method of claim 1 wherein said first exposure level is between about 20 and 30 $\mu C/cm^2$ for a 50 keV electron beam.

7. The method of claim 1 wherein said second exposure level is between about 6 and 12 $\mu C/cm^2$ for a 50 keV electron beam.

8. The method of claim 1 wherein said opaque material in said fourth pattern region prevents the transmission of light through said fourth pattern region of said attenuating phase shifting mask.

9. The method of claim 1 wherein said critical width is between about 500 and 1500 Angstroms.

10. A method of forming an attenuating phase shifting mask, comprising:

providing a photomask blank comprising a layer of attenuating phase shifting material overlaying a transparent mask substrate and a layer of chrome overlaying said layer of attenuating phase shifting material;

forming a layer of resist on said layer of attenuating phase shifting material;

exposing a main pattern region of said layer of resist using a single modulated electron beam without exposing a border region of said layer of resist surrounding said main pattern region of said layer of resist thereby exposing a number of first pattern regions in said main pattern region with a first exposure level and an equal number of third pattern regions in said main pattern region with a second exposure level without exposing an equal number of second pattern regions in said main pattern region, wherein each of said second pattern regions surrounds one of said first pattern regions providing a critical width of unexposed resist around each of said first pattern regions, each of said third pattern regions surrounds one of said second pattern regions, and said second exposure level is less than said first exposure level;

developing said layer of resist thereby removing that part of said resist in said first pattern regions, exposing said layer of chrome in said first pattern regions, reducing the thickness of said resist in said third pattern regions, leaving the full thickness of said resist in said second pattern regions, and leaving the full thickness of said resist in said border region;

etching away said chrome in said first pattern regions using wet etching and said developed layer of resist as a mask thereby exposing said layer of attenuating phase shifting material in said first pattern regions;

etching away said attenuating phase shifting material in said first pattern regions using dry anisotropic etching and said developed layer of resist as a mask;

removing the remaining part of said layer of resist in said main pattern region using oxygen plasma etching thereby leaving a reduced thickness of resist in said border region;

etching away the remaining part of said chrome in said main pattern region using wet etching and said reduced thickness of resist in said border region as a mask thereby leaving said chrome in said border region; and removing the remaining said resist.

11. The method of claim 10 wherein said attenuating phase shifting material comprises MoSiON having a thickness of between about 900 and 1350 Angstroms.

12. The method of claim 10 wherein said attenuating phase shifting material comprises CrON having a thickness of between about 900 and 1350 Angstroms.

13. The method of claim 10 wherein said chrome has a thickness of between about 500 and 1000 Angstroms.

14. The method of claim 10 wherein said transparent mask substrate is quartz.

15. The method of claim 10 wherein said first exposure level is between about 20 and 30 $\mu C/cm^2$ for a 50 keV electron beam.

16. The method of claim 10 wherein said second exposure level is between about 6 and 12 $\mu C/cm^2$ for a 50 keV electron beam.

17. The method of claim 10 wherein said chrome in said border region prevents the transmission of light through said fourth pattern region of said attenuating phase shifting mask.

18. The method of claim 10 wherein said critical width is between about 500 and 1500 Angstroms.

* * * * *